(12) United States Patent
Lee et al.

(10) Patent No.: US 7,450,439 B2
(45) Date of Patent: Nov. 11, 2008

(54) APPARATUS FOR GENERATING INTERNAL VOLTAGE

(75) Inventors: Kang-Seol Lee, Kyoungki-do (KR); Young-Jun Ku, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 201 days.

(21) Appl. No.: 11/321,115

(22) Filed: Dec. 28, 2005

(65) Prior Publication Data

US 2006/0232302 A1    Oct. 19, 2006

(30) Foreign Application Priority Data

Mar. 31, 2005    (KR)    .................. 10-2005-0027405

(51) Int. Cl.
*G11C 5/14*    (2006.01)
(52) U.S. Cl. .............. 365/189.09; 365/226; 365/210.12
(58) Field of Classification Search ............ 365/189.09, 365/226, 227; 327/534
See application file for complete search history.

(56) References Cited

U.S. PATENT DOCUMENTS

| | | | |
|---|---|---|---|
| 5,166,558 A * | 11/1992 | Ohsawa | ................ 326/71 |
| 5,808,953 A | 9/1998 | Kim et al. | |
| 6,194,887 B1 * | 2/2001 | Tsukada | ................ 323/315 |
| 6,518,831 B1 * | 2/2003 | Hur et al. | ................ 327/537 |
| 6,639,419 B2 | 10/2003 | Kim | |
| 6,707,280 B1 * | 3/2004 | Liu et al. | ................ 323/224 |
| 6,765,428 B2 * | 7/2004 | Kim et al. | ................ 327/534 |
| 6,891,773 B2 | 5/2005 | Park | |
| 7,336,108 B2 * | 2/2008 | Takeuchi | ................ 327/89 |
| 2005/0087774 A1 | 4/2005 | Katsuki et al. | |

FOREIGN PATENT DOCUMENTS

| | | |
|---|---|---|
| JP | 2003-317476 | 11/2003 |
| JP | 2003-338550 | 11/2003 |
| KR | 2001-0059032 | 7/2001 |
| KR | 2001-0065691 | 7/2001 |

* cited by examiner

*Primary Examiner*—Van Thu Nguyen
*Assistant Examiner*—Han Yang
(74) *Attorney, Agent, or Firm*—Blakely, Sokoloff, Taylor & Zafman

(57) ABSTRACT

An internal voltage generator according to the present invention stably supplies an internal voltage regardless a level of power voltage input from a source external to a semiconductor memory device. The present invention includes a dead zone controller to generate a reference voltage, a high reference voltage and a low reference voltage based on an inputted power voltage; and an internal power generator to generate an internal power based on the reference voltage by comparing the internal power with the high reference voltage and the low reference voltage.

15 Claims, 10 Drawing Sheets

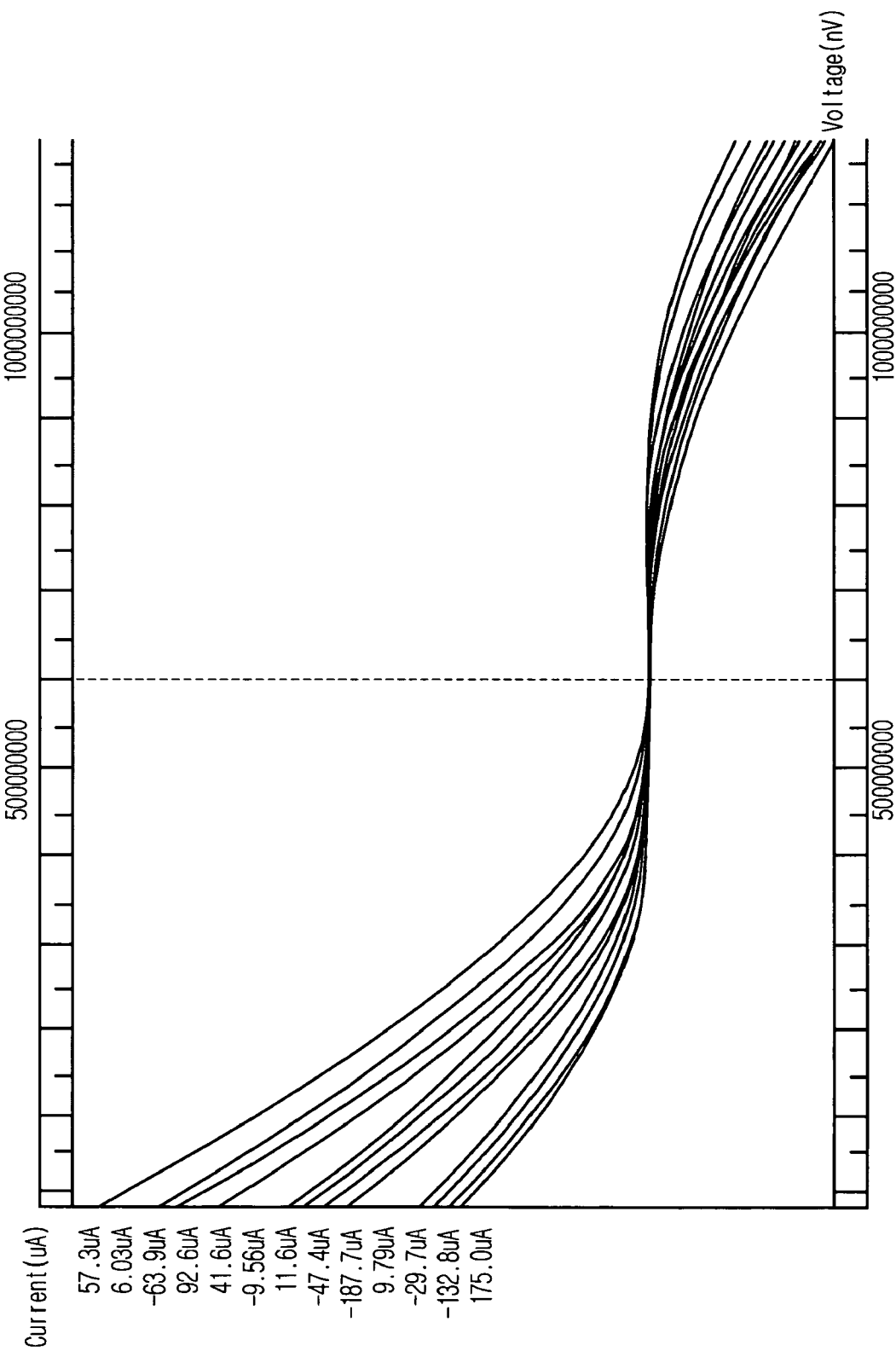

APPARATUS FOR GENERATING INTERNAL VOLTAGE

FIELD OF INVENTION

An embodiment of the invention relates to a design technology of a semiconductor memory device; and, more particularly, to an internal voltage generator for stably supplying an internal voltage.

DESCRIPTION OF RELATED ARTS

As a semiconductor memory device is recently developed for a low power condition or a low power voltage condition, the semiconductor memory device includes an internal voltage generator for generating and supplying internal voltages, each having different voltage level, based on an external power voltage supplied to the semiconductor memory device.

For example, a bit line precharge voltage VBLP is one of the internal voltages generated by the internal voltage generator. VBLP is used to precharge a bit line in the semiconductor memory device, having a middle level between voltage levels of a logic low data and a logic high data. Generally, a level of the bit line precharge voltage VBLP is a half level ½ Vcc of the logic high data '1' stored in a unit cell, designated for minimizing a power consumption during equalization.

For another example, a cell plate voltage VCP is one of the internal voltages. VCP is supplied to one side of a cell capacitor in the unit cell of the semiconductor memory device. Herein, the cell plate voltage VCP is also a half level ½ Vcore which is substantially equivalent to that of the bit line precharge voltage VBLP. If ½ Vcore is supplied to the cell capacitor as the cell plate voltage VCP, a reliability of the cell capacitor can be guaranteed regardless of a voltage level of data stored in the capacitor. Even though a difference between the logic high data and the logic low data stored in the capacitor is small, a sense amplifier can detects whether a predetermined voltage outputted from the unit cell is a logic high data or a logic low data when the cell plate voltage is ½ Vcore.

FIG. 1 is a schematic circuit diagram showing a conventional internal voltage generator.

As shown, the conventional internal voltage generator for generating a bit line precharge voltage VBLP includes six MOS transistors. In detail, a first PMOS transistor PM1 having a gate coupled to a power ground VSS is coupled between a power source VCC and a first node N1. At the first node N1, a first NMOS transistor NM1 is coupled. Herein, the first NMOS transistor NM1 is diode-connected and coupled to the first PMOS transistor PM1 in a direction of forward bias. Also, a second diode-connected PMOS transistor PM2 is coupled between the first NMOS transistor NM1 and a second node N2 in a direction of forward bias. At the second node N2, a second NMOS transistor NM2 is coupled. The second NMOS transistor NM2 having a gate for receiving a power source VCC is located between the second node N2 and a power ground VSS.

Further, the first node N1 is coupled to a gate of a third NMOS transistor NM3, and the second node N2 is coupled to a gate of a third PMOS transistor PM3. The third NMOS transistor NM3 is coupled between a power source VCC and the third PMOS transistor PM3, and the third PMOS transistor is arranged between the third NMOS transistor NM3 and a power ground VSS. The bit line precharge voltage VBLP is outputted from an output node between the third PMOS transistor and the third NMOS transistor.

Referring to FIG. 1, in the conventional internal voltage generator, the first and second PMOS transistors PM1 and PM2 and the first and second NMOS transistors NM1 and NM2 located between the power source VCC and the power ground VSS build up a predetermined constant resistance ratio between voltages, each supplied at the first and second nodes N1 and N2.

Then, the bit line precharge voltage VBLP is pulled up by the third NMOS transistor coupled to the first node N1 and is pulled down by the third PMOS transistor coupled to the second node N2.

With a reference, in the conventional internal voltage generator, the output node for generating the bit line precharge voltage VBLP is coupled to sources of the third PMOS and NMOS transistors PM3 and NM3; this formation is generally called a source follower.

Meanwhile, because of the source follower embedded in the conventional internal voltage generator described above, a driving capability is relatively lower than other conventional internal voltage generators. In addition, because of a change of a threshold voltage of MOS transistors, a dead zone also changes and, as a result, the driving capability of the conventional internal voltage generator fluctuates. Herein, the dead zone means a region where the driving capability is too low to appropriately generate an internal voltage.

FIG. 2 is a schematic circuit diagram describing another conventional internal voltage generator.

As shown, the conventional internal voltage generator includes a reference voltage generator 10, a first bias voltage generator 20, a second bias voltage generator 30, a control voltage generator 40, a driving signal generator 50 and an output driver 60.

The reference voltage generator 10 generates a reference voltage REF by dividing a power core VCORE by a predetermined value, including resistors and diode-connected transistors, each served as a resister, coupled to each other in series between the power core VCORE and a power ground VSS. Based on the reference voltage REF, the first bias voltage generator 20 generates an N-bias voltage N_BS to control a current flow to the power ground VSS. The second bias voltage generator 30 outputs a P-bias voltage P_BS to control a current flow from the power core VCORE into the driving signal generator 50 by mirroring a current flowing in the first bias voltage generator 20.

Then, the control voltage generator 40 generates a high control signal N_GT the threshold voltage of MOS transistor higher than the reference voltage VEF and a low control signal P_GT the threshold voltage of MOS transistor lower than the reference voltage REF, based on the reference voltage REF and the N-bias voltage N_BS and by mirroring a current flowed in the second bias voltage generator 30. In response to the P-bias voltage P_BS, the N-bias voltage N_BS, the high control signal H_GT and the low control signal L_GT, the driving signal generator 50 generates a pull-up driving signal P_DRV, a pull-down driving signal N_DRV and a bit line precharge voltage VBLP. The bit line precharge voltage VBLP is supported by the output driver 60 controlled by the pull-up and pull-down driving signals P_DRV and N_DRV.

In a view of operation, the conventional internal voltage generator shown in FIG. 2 is more described in detail.

When a level of the bit line precharge voltage VBLP is not changed, levels of the pull-up and pull-down driving signals P_DRV and N_DRV are constantly maintained so that the level of the bit line precharge voltage VBLP is kept invariant. However, if the bit line precharge voltage VBLP is higher than the reference voltage REF, levels of the pull-up and pull-down driving signals P_DRV and N_DRV becomes higher to thereby increase a driving capability of an NMOS transistor included in the output driver 60 and, as a result, a level of the bit line precharge voltage VBLP is decreased.

Conversely, if the bit line precharge voltage VBLP is lower than the reference voltage REF, levels of the pull-up and pull-down driving signals P_DRV and N_DRV becomes lower to thereby increase a driving capability of an PMOS transistor included in the output driver 60 and, as a result, a level of the bit line precharge voltage VBLP is increased.

Herein, a level of the pull-up driving signal P_DRV swings from the power core VCORE to a half of power core ½ VCORE. Therefore, if the power core VCORE is decreased under a predetermined level when the bit line precharge voltage VBLP is ½ VCORE, a level difference between the pull-up driving signal P_DRV and the bit line precharge voltage VBLP can be smaller than a threshold voltage of an MOS transistor. At this time, the MOS transistors included in the output driver 60 are not turned on sufficiently and, the conventional internal voltage generator cannot operate appropriately.

FIGS. 3A and 3B are graphs demonstrating a current level outputted from the conventional internal voltage generator shown in FIG. 2 in response to an inputted power core VCORE. Herein, an X-axis is a level of the power core VCORE and a Y-axis is a level of the current level.

As shown, the smaller the power core VCORE is, the smaller the current level is. More particularly, when a level difference between the pull-up driving signal P_DRV and the bit line precharge voltage VBLP is smaller than a threshold voltage of the MOS transistors included in the output driver 60, the driving capability of the output driver 60 is dramatically decreased.

As described above, since a conventional internal voltage generator has a driving capability which decreases when a level of a power core VCORE or a power source VCC decreases, functional blocks supplied with an internal voltage such as a bit line precharge voltage VBLP or a cell plate voltage VCP can perform erroneous operations. Herein, the power core VCORE and the power source VCC are provided external to the semiconductor memory device.

Particularly, as the external voltage input becomes lower, the above described defect of the conventional internal voltage generator manifests itself.

SUMMARY OF THE INVENTION

One embodiment of the invention provides an internal voltage generator to stably supply an internal voltage regardless a level of power voltage input from a power source external to a semiconductor memory device.

In accordance with an embodiment of the present invention, there is an internal power supplying device, including a dead zone controller to generate a reference voltage, a high reference voltage and a low reference voltage based on an input power voltage; and an internal power generator to generate an internal power based on the reference voltage by comparing the internal power with the high reference voltage and the low reference voltage.

In accordance with one embodiment of the present invention, there is a semiconductor memory device comprising a device for supplying an internal power, the device including a dead zone control block for generating a reference voltage, a high reference voltage and a low reference voltage based on an inputted power voltage; and an internal power generating block for generating an internal power based on the reference voltage by comparing the internal power with the high reference voltage and the low reference voltage.

BRIEF DESCRIPTION OF THE DRAWINGS

The above features of embodiments of the present invention will become better understood with respect to the following description of the specific embodiments given in conjunction with the accompanying drawings, in which:

FIGS. 3A and 3B are graphs demonstrating a current level outputted from the conventional internal voltage generator shown in FIG. 2 in response to an inputted power core;

DETAILED DESCRIPTION OF THE INVENTION

Hereinafter, a semiconductor device in accordance with an embodiment of the present invention is described in detail with reference to the accompanying drawings.

An apparatus for generating an internal power voltage according to the present invention can be applied to a semiconductor memory device or other controllers using plural internal powers, each having different level.

Figure 1:
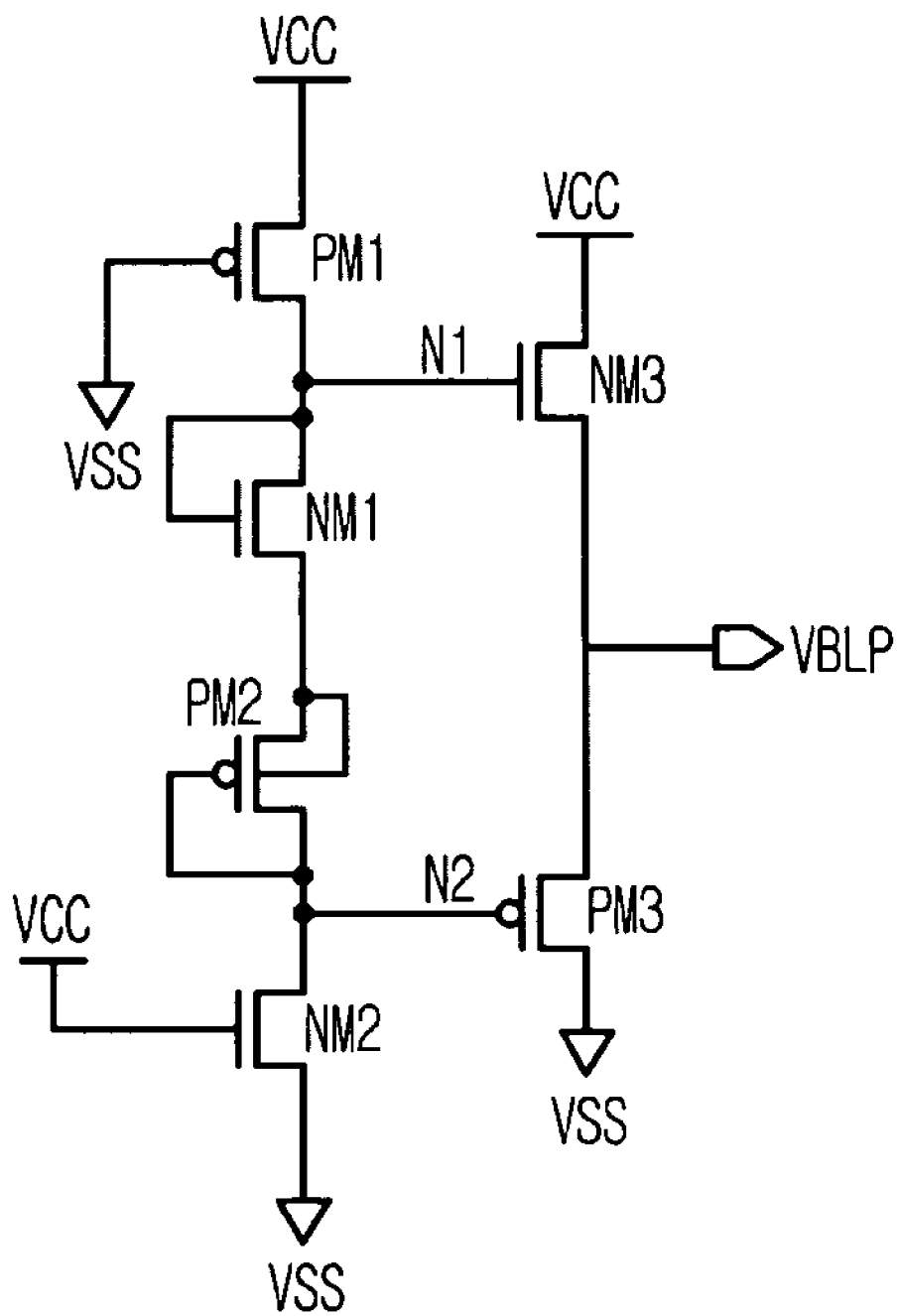
FIG. 1 is a schematic circuit diagram showing a conventional internal voltage generator.
Figure 2:
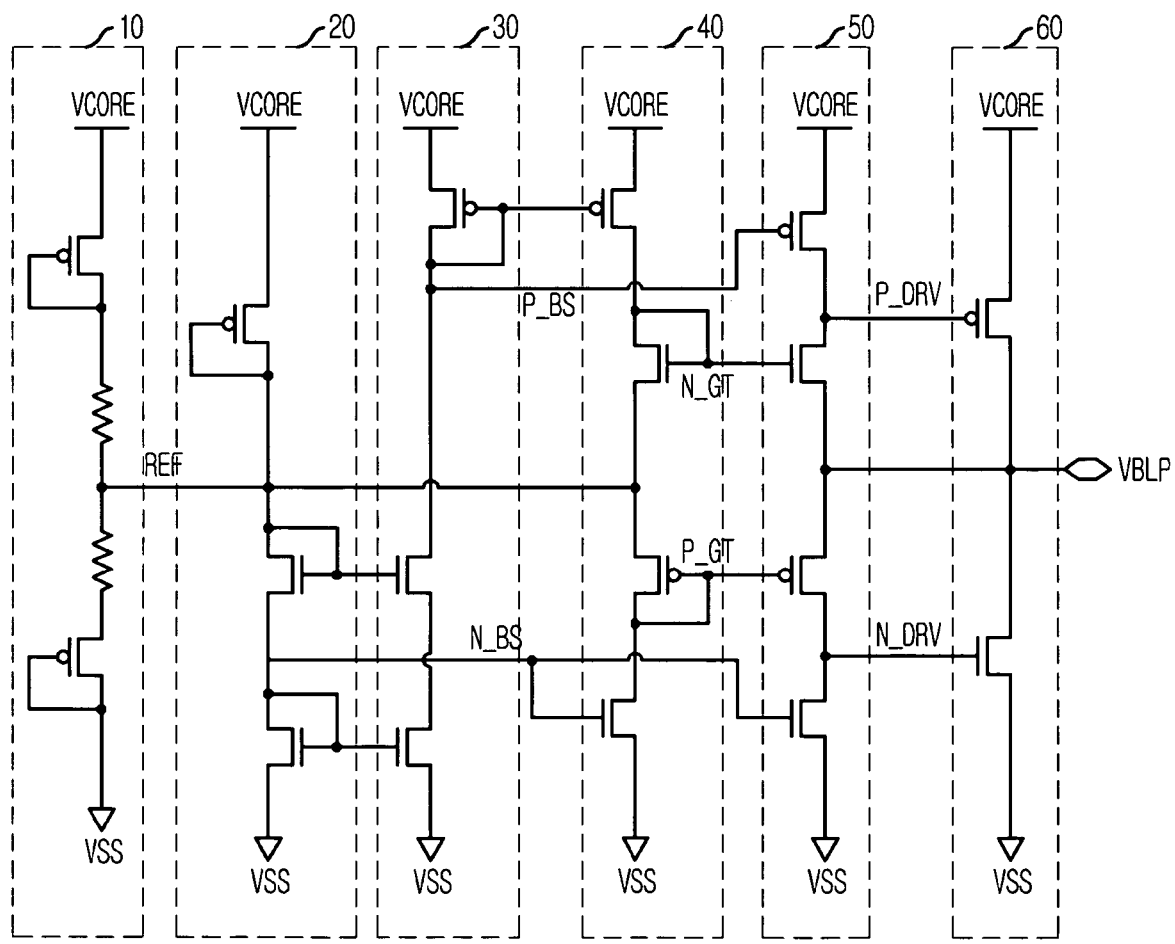
FIG. 2 is a schematic circuit diagram describing another conventional internal voltage generator.
Figure 3B:
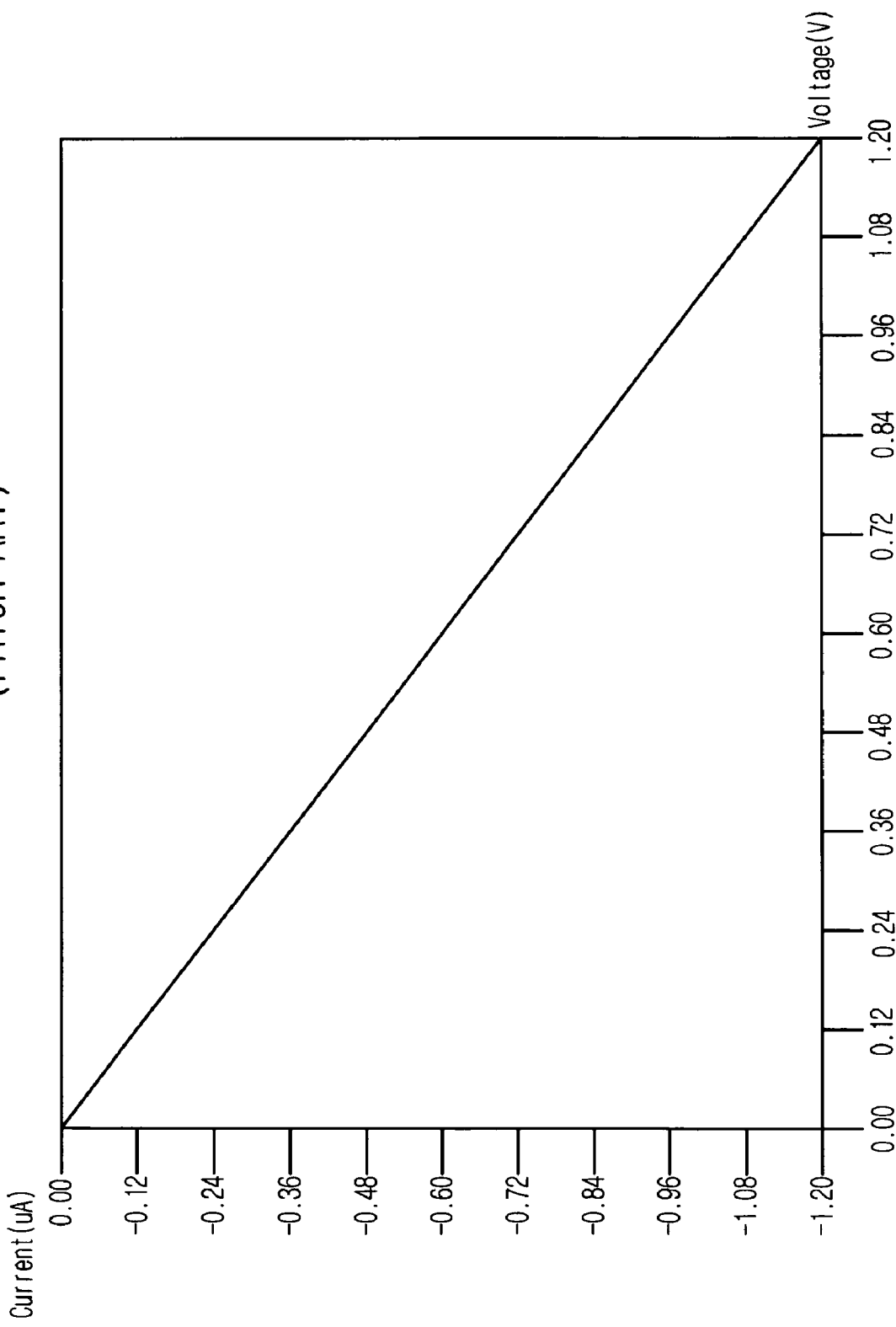
Figure 4:
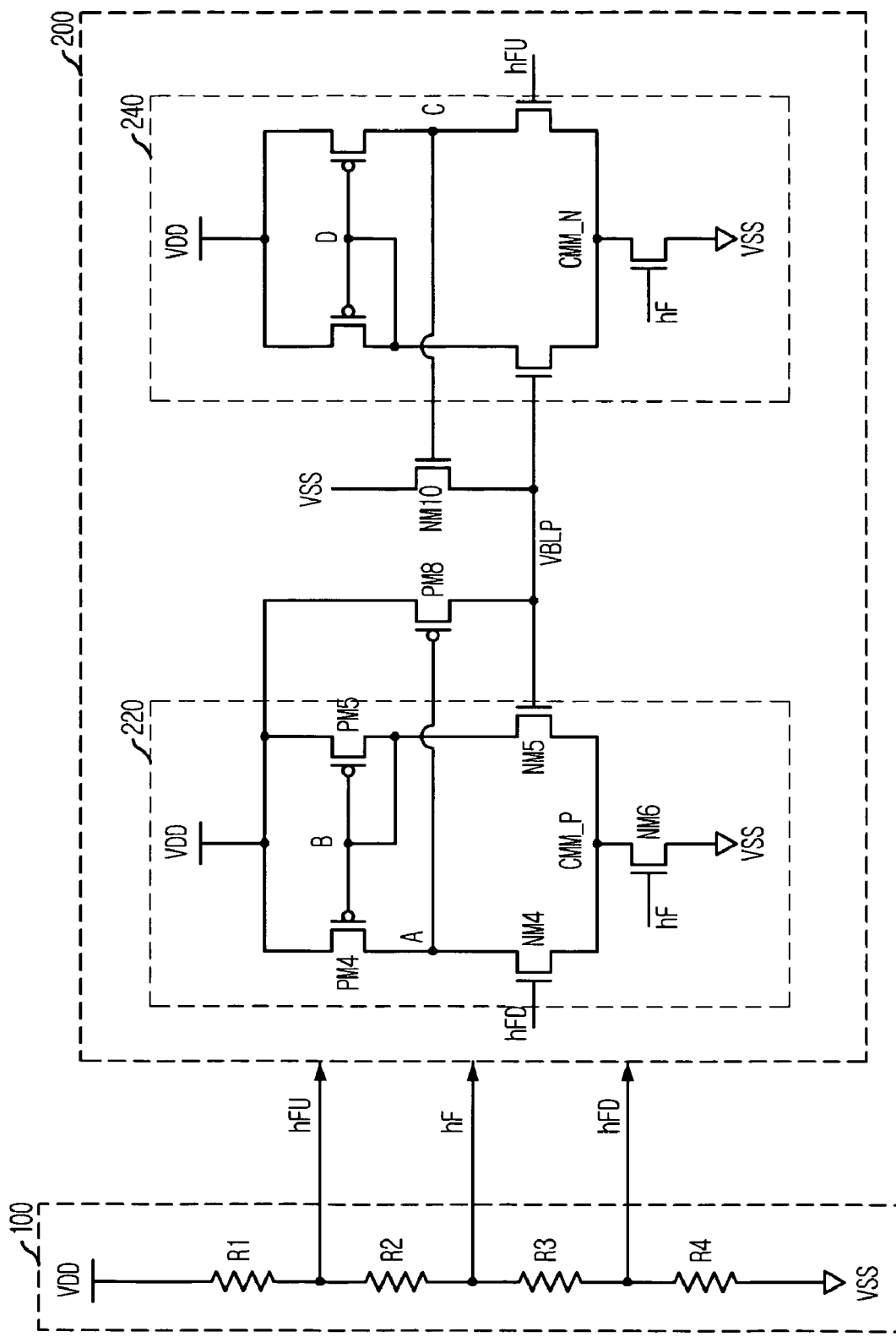
FIG. 4 is a schematic circuit diagram showing an internal voltage supplying block in accordance with a first embodiment of the present invention.

FIG. 4 is a schematic circuit diagram showing an internal voltage supplying block in accordance with a first embodiment of the present invention.

As shown, the internal voltage supplying block includes a dead zone controller 100 and an internal power generator 200. The dead zone controller 100 generates a reference voltage hF, a high reference voltage hFU and a low reference voltage hFD based on an inputted power voltage VDD. The reference voltage hF, the high reference voltage hFU and the low reference voltage hFD are inputted to the internal power generator 200. The internal power generator 200 generates an internal power VBLP based on the reference voltage hF by comparing the internal power VBLP with the high reference voltage hFU and the low reference voltage hFD.

To generate the reference voltage hF, the high reference voltage hFU and the low reference voltage hFD, the dead zone controller 100 includes first to fourth resistors R1 to R4 coupled in series between the power voltage VDD and a power ground VSS. The first and fourth resistors R1 and R4 have larger resistance than the second and third resistors R2 and R3.

The high reference voltage hFU is output between the first and the second resistors R1 and R2; and the reference voltage hF is output between the second and third resistors R2 and R3. Lastly, the low reference voltage hFD is output between the third and the fourth resistors R3 and R4.

Herein, the high reference voltage hFU which is higher than the reference voltage is used for deciding whether or not a level of the internal power VBLP is increased. Also, the low reference voltage hFD which is lower than the reference voltage is used for determining whether or not a level of the internal power VBLP is decreased.

Referring to FIG. 4, the internal power generator 200 includes a level-down detecting block 220, a pull-down driver NM10, a level-up detecting block 240 and a pull-up driver PM8.

The level-down detecting block 220 compares the internal power VLBP with the low reference voltage hFD to output a pull-up control signal to the pull-up driver PM8. In response to the pull-up control signal generated from the level-down detecting block 220, the pull-up driver PM8 pulls up a level of the internal power VBLP.

Likewise, the level-up detecting block 240 compares the internal power VLBP with the high reference voltage hFU to generate a pull-down control signal. Then, the pull-down driver NM10 pulls down the internal power VBLP in response to the pull-down control signal.

Herein, the level-down detecting block 220 constituted with a current mirroring circuit includes a first current source, a first voltage input block and a first control signal generator. The first current source receives the reference voltage hF to serves as a current source of the level down detecting block 220. Thus, the level-down detecting block can be disabled in response to the reference voltage hF. The low reference voltage hfD and the internal power VBLP are inputted to the level-down detecting block through the first voltage input block coupled to the first current source. Lastly, the first control signal generator coupled to the first voltage input block generates the pull-up control signal based on a comparison result of the internal power VBLP and the low reference voltage hFD.

Likewise, the level-up detecting block is very similar in structure to the level-down detecting block, but has a different input voltage. That is, though the low reference voltage hFD is input to the level-down detecting block 220, the high reference voltage hFU is input to the level-up detecting block 240.

In detail, the level-down and level-up detecting blocks are respectively five MOS transistors. Referring to FIG. 4, the level-down detecting block 220 includes a first NMOS transistor NM6 coupled to the power ground VSS to cause current to flow in response to the reference voltage hF input at its gate; a second NMOS transistor NM4 coupled to the first NMOS transistor NM6 to receive the low reference voltage hFD input at its gate; a third NMOS transistor NM5 coupled to the first NMOS transistor NM6 to receive the internal power VBLP input at its gate; a first diode connected PMOS transistor PM5 coupled between the power voltage VDD and the third NMOS transistor NM5, and a second PMOS transistor PM4 coupled between the power voltage VDD and the second NMOS transistor NM4. As shown, the gate of the second PMOS transistor PM4 is coupled to the gate of the first PMOS transistor PM5 to generate the pull-up control signal based on a comparison result of the internal power VBLP and the low reference voltage hFD by current-mirroring.

The pull-up driver PM8 includes a PMOS transistor having its gate coupled to the pull-up control signal, its source coupled to the power voltage VDD and its drain to support a level of the internal power VBLP. Similar to the pull-up driver PM8, the pull-down driver NM10 includes an NMOS transistor having its gate coupled to the pull-down control signal, its source coupled to the power ground VSS and its drain to support the level of the internal power VBLP.

Hereinafter, an operation of the internal voltage supplying block according to embodiments of the present invention is described in detail.

If the internal power VBLP is lower than the low reference voltage hFD, a voltage level supplied at a first node A in the level-down detecting block 220 is decreased. Namely, a level of the pull-up control signal is decreased. Thus, in response to a low level of the pull-up control signal, the pull-up driver PM8 is turned on to increase a driving capability of the pull-up driver PM8; and, as a result, a level of the internal power VBLP is pulled up.

Further, if the internal power VBLP is higher than the high reference voltage hFU, a voltage level supplied at a first node C in the level-up detecting block 240 is increased. Namely, a level of the pull-down control signal is increased. Thus, in response to a high level of the pull-up control signal, the pull-down driver NM10 is turned on to increase a driving capability of the pull-down driver NM10; and, as a result, a level of the internal power VBLP is pulled down.

Therefore, the internal power VBLP generated by the internal power generator 200 in accordance to the present invention is kept within a voltage range between levels of the high reference voltage hFU and the low reference voltage hFD. Herein, the high reference voltage hFU and the low reference voltage hFD are outputs from the dead zone controller 100.

Meanwhile, as above described, each current source of the level-up and level-down detecting block 220 and 240 in the internal power generator 200 are turned on based on the reference voltage hF. Thus, if a level of the power voltage VDD is lower than a threshold voltage of an MOS transistor, the internal power generator 200 is disabled. Namely, the internal power supplying block is enabled when the power voltage VDD has a predetermined level larger than a threshold voltage of an MOS transistor.

Therefore, in the internal power supplying block according to the present invention, protects against improper operation when a level difference between an inputted power voltage and an internal power is smaller than a threshold voltage of an MOS transistor. In addition, since the internal power VBLP is electronically separated from both the power voltage VDD and the power ground VSS, and since the reference voltage hF is used to enable the internal power generator 200, unnecessary power consumption by the internal power generating block is decreased.

FIGS. 5A to 5F are schematic circuit diagrams depicting dead zone controllers in accordance with other embodiments of the present invention.

Figure 5A:
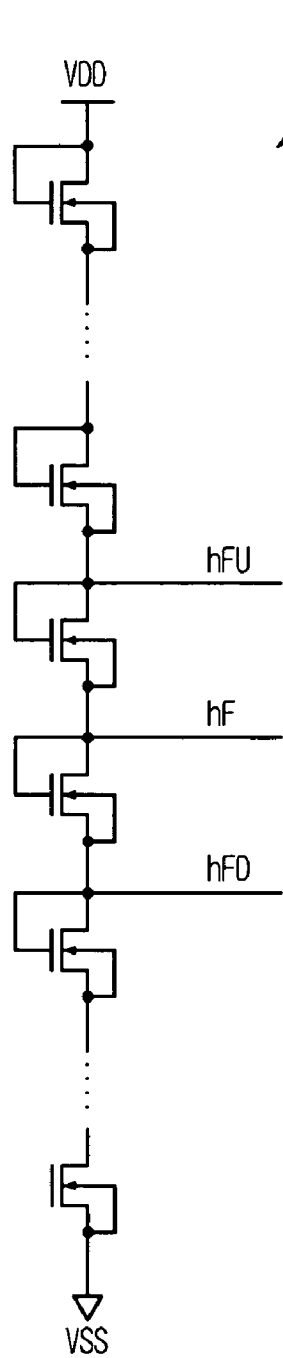
FIGS. 5A to 5F are schematic circuit diagrams depicting dead zone controllers in accordance with other embodiments of the present invention.

Referring to FIG. 5A, a dead zone controller 100A includes a plurality of diode-connected NMOS transistors coupled in series between the power voltage VDD and the power ground VSS to generate the reference voltage hF, the high reference voltage hFU and the low reference voltage hFD.

Figure 5B:
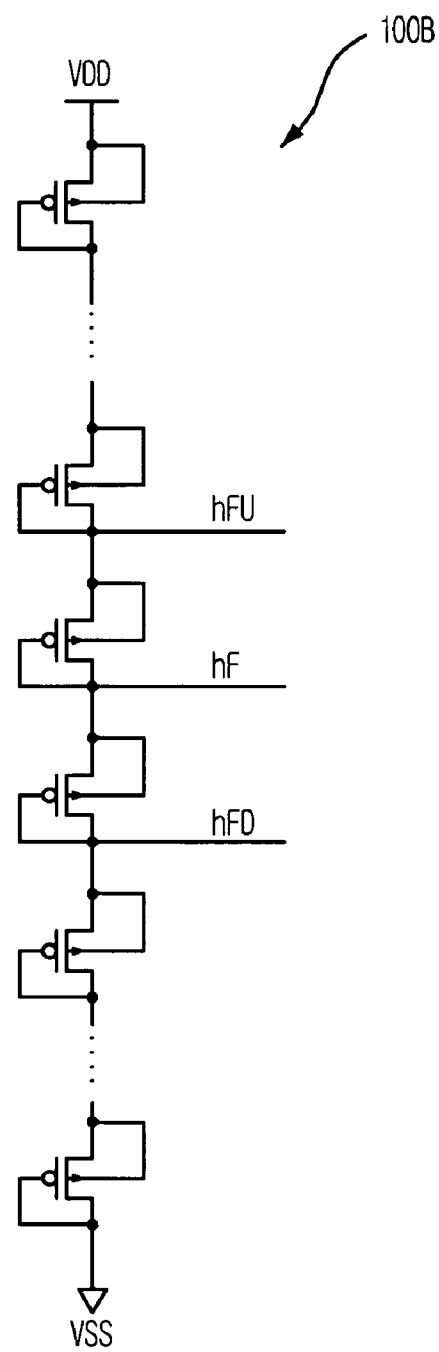

Likewise, referring to FIG. 5B, a dead zone controller 100B includes a plurality of diode-connected PMOS transistors coupled in series between the power voltage VDD and the power ground VSS.

Figure 5C:
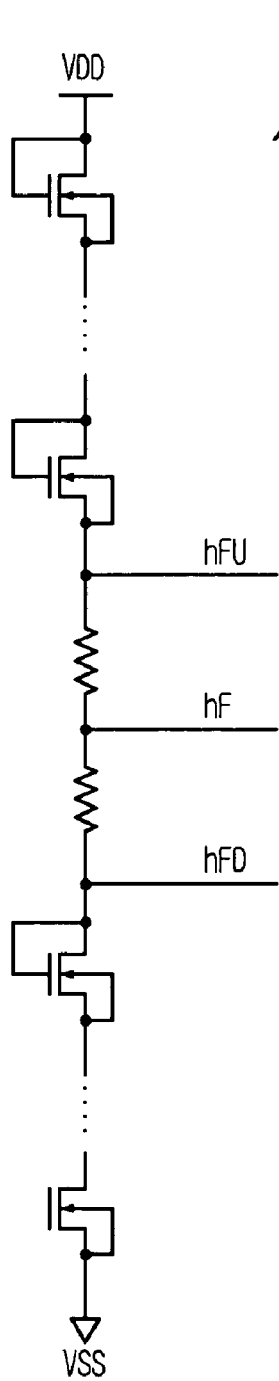

As shown in FIG. 5C, a dead zone controller 100C includes a plurality of diode-connected NMOS transistors and a plurality of resistors coupled in series between the power voltage VDD and the power ground VSS to generate the reference voltage hF, the high reference voltage hFU and the low reference voltage hFD.

Figure 5D:
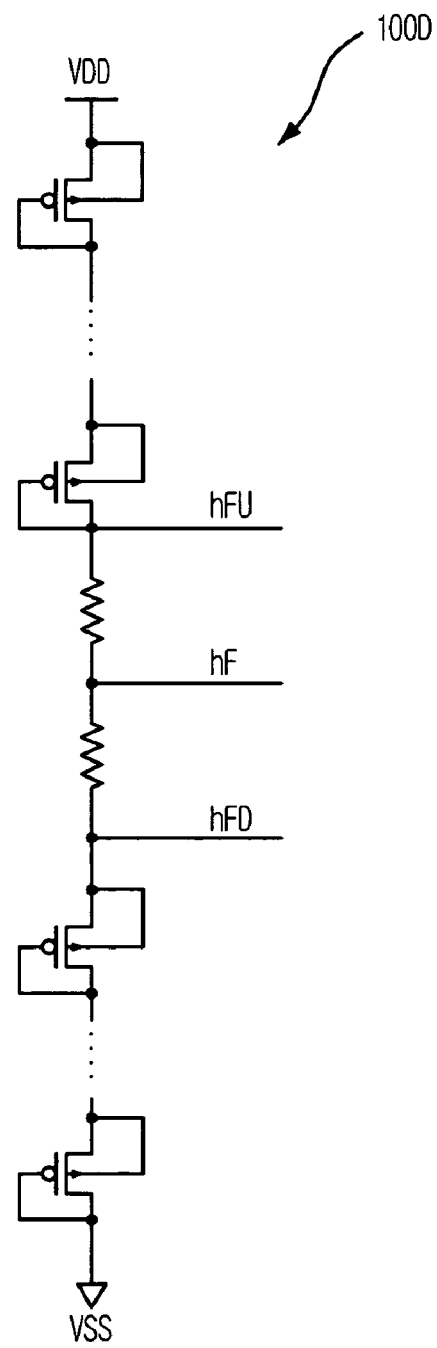

Similar to the dead zone controller 100C, referring to FIG. 5D, a dead zone controller 100D includes a plurality of diode-connected PMOS transistors and a plurality of resistors coupled in series between the power voltage VDD and the power ground VSS.

Figure 5E:
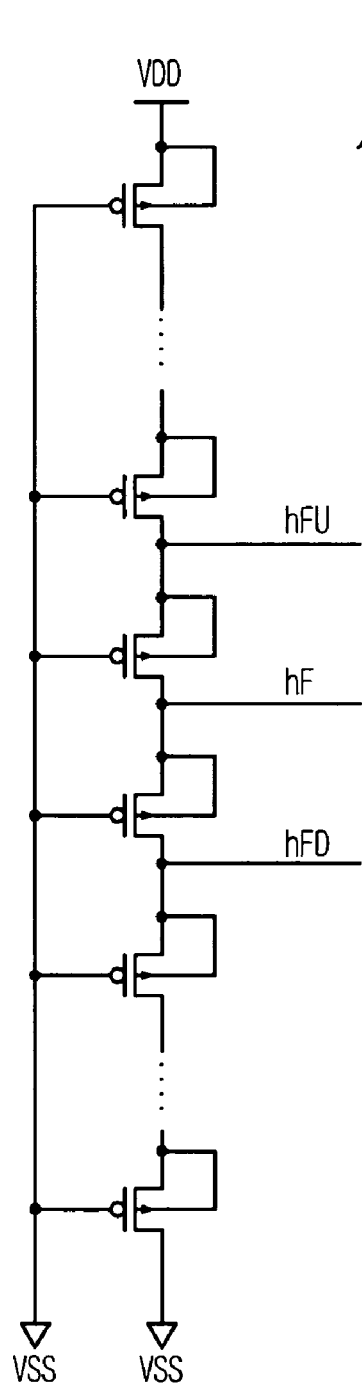

Referring to FIG. 5E, a dead zone controller 100E includes a plurality of active resistors, each constituted with a PMOS transistor, coupled in series between the power voltage VDD and the power ground VSS to generate the reference voltage hF, the high reference voltage hFU and the low reference voltage hFD.

Figure 5F:
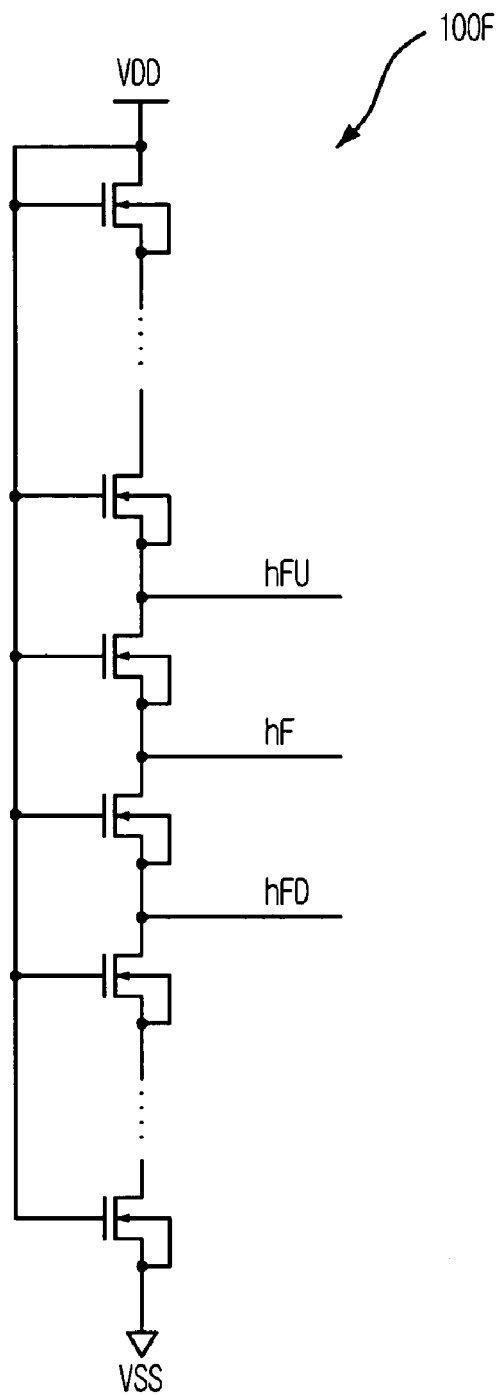

Likewise, as shown in FIG. 5F, a dead zone controller 100F includes a plurality of active resistors, each constituted with an NMOS transistor, coupled in series between the power voltage VDD and the power ground VSS.

As above described, any of the dead zone controllers 100A to 100F may be used to output the reference voltage hF, the high reference voltage hFU and the low reference voltage hFD to the internal power generator 200. Thus in various embodiments, the dead zone controller may have the plurality of diode-connected MOS transistors, the plurality of active or passive resistors, a combination of the plurality of diode-connected MOS transistors and the plurality of active or passive resistors.

Figure 6:
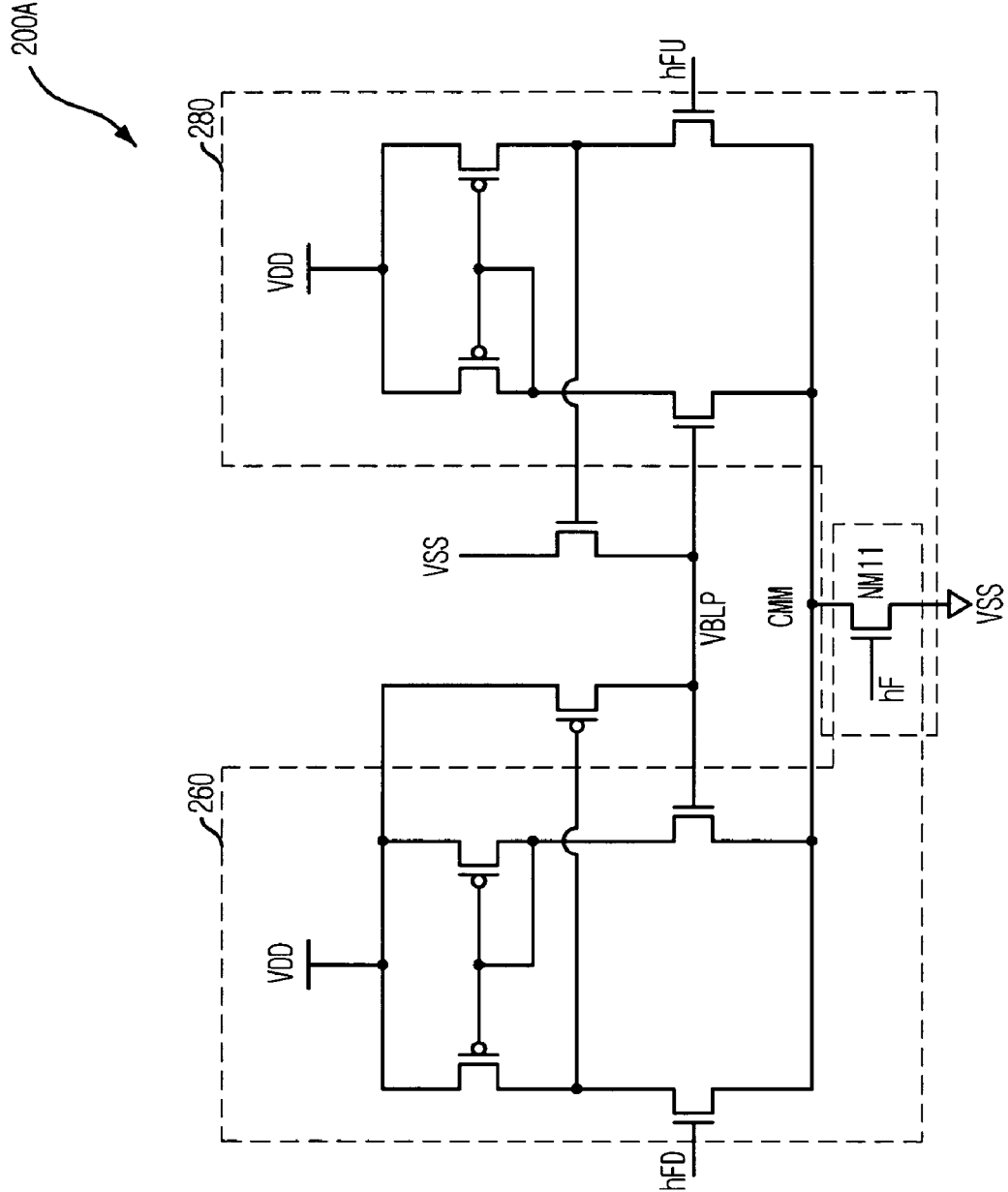
FIG. 6 is a schematic circuit diagram describing an internal power generator in accordance with another embodiment of the present invention.

FIG. 6 is a schematic circuit diagram describing an internal power generator 200A in accordance with another embodiment of the present invention.

As shown, a level-down and a level-up detecting blocks 260 and 280 share a current source NM11 in common. Herein, the current source NM11 controls current flows of the level-down and the level-up detecting blocks 260 and 280 in response to the reference voltage hF.

Figure 7:
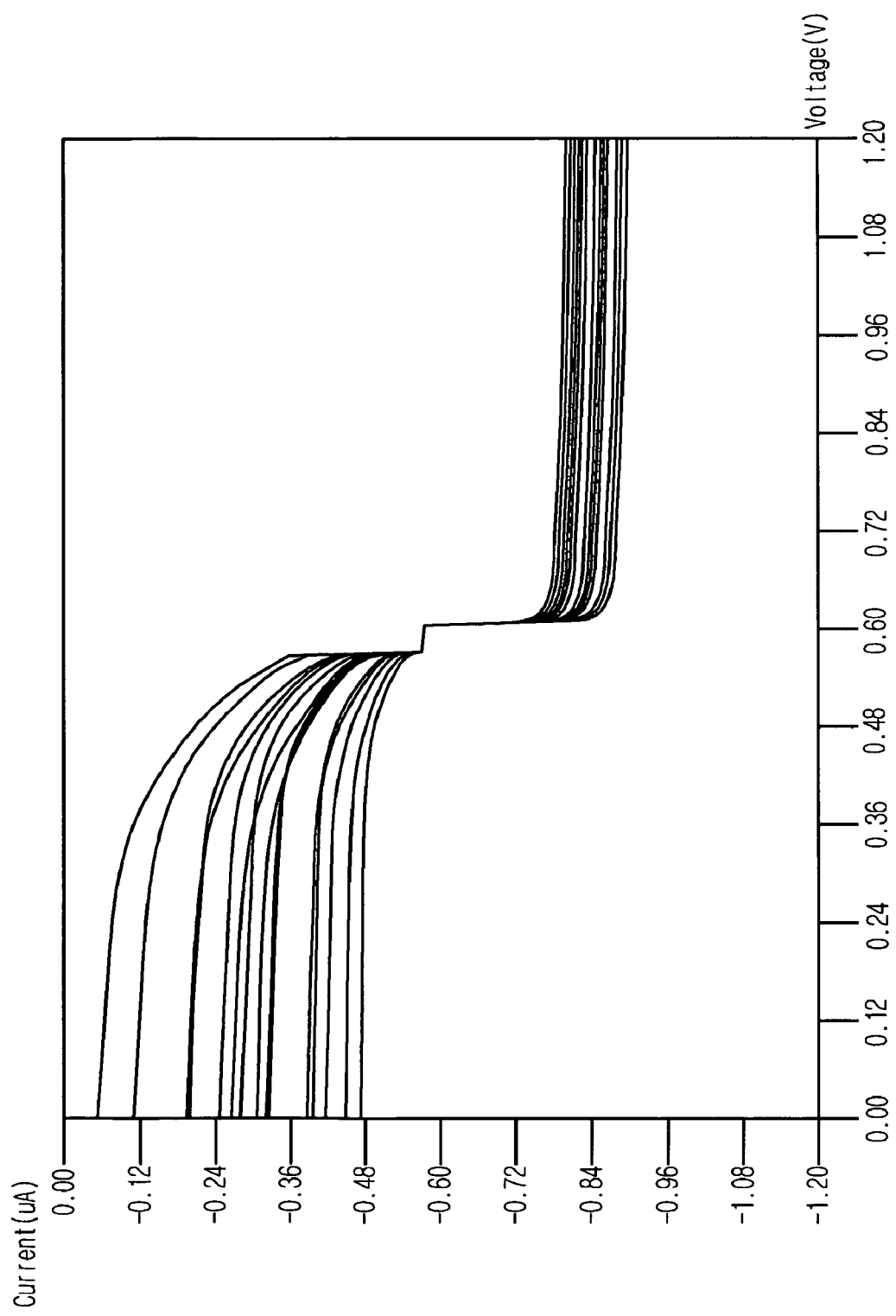
FIG. 7 is a graph demonstrating a current level outputted from the internal voltage supplying block shown in FIG. 4 in response to a power voltage.

FIG. 7 is a graph demonstrating a current level outputted from the internal voltage supplying block shown in FIG. 4 in response to the power voltage VDD.

As shown, the internal voltage supplying block according to the present invention can stably maintain a level of the internal power VBLP even though a level of the power voltage VDD is decreased.

Thus, the internal voltage supplying block according to the present invention generates the internal power VBLP having a half level ½VDD of the power voltage VDD when the power voltage VDD is larger than a threshold voltage of an MOS transistor.

On the other hand, in the present invention, the internal voltage supplying block generates the internal power VBLP used for precharging a bit line included in a semiconductor memory device; however, the internal power VBLP can be applied to other circuits requiring a half level of an inputted power voltage.

Likewise, in one embodiment the present invention, the internal voltage supplying block receives the power voltage VDD. Herein, the power voltage VDD can be substituted with another driving voltage suited for functional circuits.

The one embodiment present invention can stably supply an internal power after generating the internal power having a half level of an inputted external power when the external power is larger than a threshold voltage of MOS transistor. In addition, a reference voltage is used to enable an internal power generating block; as a result, a power consumption of the internal power generating block can be decreased.

The present application contains subject matter related to the Korean patent application No. KR 2005-0027405, filed in the Korean Patent Office on Mar. 31, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. An internal power supplying device, comprising:
   a dead zone controller to generate a reference voltage, a high reference voltage and a low reference voltage by dividing an input power voltage; and
   an internal power generator to generate an internal power based on the reference voltage by comparing the internal power with the high reference voltage and the low reference voltage,
   wherein the high reference voltage that is higher than the reference voltage is used to decide whether or not a level of the internal power is increased and the low reference voltage that is lower than the reference voltage is used to decide whether or not a level of the internet power is decreased,
   wherein the dead zone controller includes first to fourth resistors coupled in series between the power voltage and a power ground to generate the reference voltage, the high reference voltage and the low reference voltage, the high reference voltage output between the first and the second resistors, the reference voltage output between the second and third resistors and the low reference voltage output between the third and the fourth resistors, and
   wherein the first and fourth resistors have larger resistance than the second and third resistors.

2. The internal power supplying device as recited in claim 1, wherein the internal power generator includes:
   a level-down detecting block to compare the internal power with the low reference voltage to generate a pull-up control signal, wherein the level-down detecting block is activated in response to the reference voltage;
   a pull-up driver to pull up the internal power in response to the pull-up control signal;
   a level-up detecting block to compare the internal power with the high reference voltage to generate a pull-down control signal, wherein the level-up detecting block is activated in response to the reference voltage; and
   a pull-down driver to pull down the internal power in response to the pull-down control signal.

3. The internal power supplying device as recited in claim 2, wherein the level-down detecting block includes:
   a first current source to receive the reference voltage;
   a first voltage input block coupled to the first current source to receive the low reference voltage and the internal power; and
   a first control signal generator coupled to the first voltage input block to generate the pull-up control signal based on a comparison result of the internal power and the low reference voltage, the first control signal generator including a current mirroring block.

4. The internal power supplying device as recited in claim 3, wherein the level-up detecting block includes:
   a second current source to receive the reference voltage;
   a second voltage input block coupled to the second current source to receive the high reference voltage and the internal power; and
   a second control signal generator coupled to the second voltage input block to generate the pull-down control signal based on a comparison result of the internal power and the high reference voltage, the second control signal generator including a current mirroring block.

5. The internal power supplying device as recited in claim 4, wherein the first current source and the second current source are substantially formed by one transistor.

6. The internal power supplying device as recited in claim 2, wherein the level-down detecting block includes:
   a first NMOS transistor coupled to a power ground to source a current in response to the reference voltage inputted at a gate;

a second NMOS transistor coupled to the first NMOS transistor to receive the low reference voltage inputted at a gate;

a third NMOS transistor coupled to the first NMOS transistor to receive the internal power inputted at a gate;

a first diode connection PMOS transistor coupled between the power voltage and the third NMOS transistor; and a second PMOS transistor coupled between the power voltage and the second NMOS transistor, wherein a gate of the second PMOS transistor is coupled to a gate of the first diode connection PMOS transistor to generate the pull-up control signal based on a comparison result of the internal power and the low reference voltage by current-mirroring.

7. The internal power supplying device as recited in claim 2, wherein the pull-up driver includes a PMOS transistor having a gate coupled to the pull-up control signal, a source coupled to the power voltage and a drain to support a level of the internal power.

8. The internal power supplying device as recited in claim 7, wherein the pull-down driver includes an NMOS transistor having a gate coupled to the pull-down control signal, a source coupled to a power ground and a drain to support the level of the internal power.

9. An internal power supplying device, comprising:

a dead zone controller to generate a reference voltage, a high reference voltage and a low reference voltage by dividing an input power voltage; and an internal power generator to generate an internal power based on the reference voltage by comparing the internal power with the high reference voltage and the low reference voltage, wherein the high reference voltage that is higher than the reference voltage is used to decide whether or not a level of the internal power is increased and the low reference voltage that is lower than the reference voltage is used to decide whether or not a level of the internet power is decreased, and wherein the dead zone controller includes a plurality of diode-connected transistors coupled in series between the power voltage and a power ground to generate the reference voltage, the high reference voltage and the low reference voltage, wherein the plurality of diode-connected transistors is one of PMOS transistors, NMOS transistors and a combination of PMOS transistors and NMOS transistors.

10. An internal power supplying device, comprising:

a dead zone controller to generate a reference voltage, a high reference voltage and a low reference voltage by dividing an input power voltage; and an internal power generator to generate an internal power based on the reference voltage by comparing the internal power with the high reference voltage and the low reference voltage, wherein the high reference voltage that is higher than the reference voltage is used to decide whether or not a level of the internal power is increased and the low reference voltage that is lower than the reference voltage is used to decide whether or not a level of the internet power is decreased, and wherein the dead zone controller includes a plurality of diode-connected transistors and a plurality of passive resistors coupled in series between the power voltage and a power ground to generate the reference voltage, the high reference voltage and the low reference voltage, wherein the plurality of diode-connected transistors is one of PMOS transistors, NMOS transistors and a combination of PMOS transistors and NMOS transistors.

11. An internal power supplying device, comprising:

a dead zone controller to generate a reference voltage, a high reference voltage and a low reference voltage by dividing an input power voltage; and an internal power generator to generate an internal power based on the reference voltage by comparing the internal power with the high reference voltage and the low reference voltage, wherein the high reference voltage that is higher than the reference voltage is used to decide whether or not a level of the internal power is increased and the low reference voltage that is lower than the reference voltage is used to decide whether or not a level of the internet power is decreased, and wherein the dead zone controller includes a plurality of active resistors, each constituted with one of a PMOS transistor and an NMOS transistor, coupled in series between the power voltage and a power ground to generate the reference voltage, the high reference voltage and the low reference voltage.

12. A semiconductor memory device, the device comprising:

a dead zone control block to generate a reference voltage, a high reference voltage and a low reference voltage by dividing an inputted power voltage; and an internal power generating block for generating an internal power based on the reference voltage by comparing the internal power with the high reference voltage and the low reference voltage, wherein the high reference voltage that is higher than the reference voltage is used to decide whether or not a level of the internal power is increased and the low reference voltage that is lower than the reference voltage is used to decide whether or not a level of the internet power is decreased, and wherein the dead zone controller includes a plurality of diode-connected transistors and a plurality of resistors coupled in series between the power voltage and a power ground to generate the reference voltage, the high reference voltage and the low reference voltage, wherein the plurality of diode-connected transistors is one of PMOS transistors, NMOS transistors and a combination of PMOS transistors and NMOS transistors and the plurality of resistors is one of passive resistors, active resistors and a combination of passive resistors and active resistors.

13. The semiconductor memory device as recited in claim 12, wherein the internal power generating block includes:

a level-down detecting block to compare the internal power with the low reference voltage to generate a pull-up control signal, wherein the level-down detecting block is activated in response to the reference voltage;

a pull-up driver to pull up the internal power in response to the pull-up control signal;

a level-up detecting block to compare the internal power with the high reference voltage to generate a pull-down control signal, wherein the level-up detecting block is activated in response to the reference voltage; and a pull-down driver to pull down the internal power in response to the pull-down control signal.

14. The semiconductor memory device as recited in claim 13, wherein the level-down detecting block includes:

a current source to receive the reference voltage;

a voltage input block coupled to the first current source to receive the low reference voltage and the internal power; and a control signal generator coupled to the voltage input block to generate the pull-up control signal based on a comparison result of the internal power and the low reference voltage, the control signal generator including a current mirroring block, wherein elements included in the level-up detecting block are substantially identical to those in the level-down detecting block.

15. The semiconductor memory device as recited in claim 14, wherein the pull-up driver and pull-down driver respectively include a MOS transistor having a gate coupled to one of the pull-up control signal and the pull-down control signal.

* * * * *